US010079261B1

(12) United States Patent
Wang et al.

(10) Patent No.: US 10,079,261 B1
(45) Date of Patent: Sep. 18, 2018

(54) RAISED ELECTRODE TO REDUCE DARK CURRENT

(71) Applicant: OMNIVISION TECHNOLOGIES, INC., Santa Clara, CA (US)

(72) Inventors: Qin Wang, San Jose, CA (US); Bill Phan, San Jose, CA (US); Sing-Chung Hu, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/680,005

(22) Filed: Aug. 17, 2017

(51) Int. Cl.
*H01L 27/146* (2006.01)
*H01L 29/417* (2006.01)
*H01L 21/3215* (2006.01)
*H01L 21/02* (2006.01)
*H01L 21/306* (2006.01)
*H01L 21/311* (2006.01)

(52) U.S. Cl.
CPC .... *H01L 27/14643* (2013.01); *H01L 27/1463* (2013.01); *H01L 27/14612* (2013.01); *H01L 27/14636* (2013.01); *H01L 27/14689* (2013.01); *H01L 29/41783* (2013.01); *H01L 21/02532* (2013.01); *H01L 21/30604* (2013.01); *H01L 21/31111* (2013.01); *H01L 21/3215* (2013.01); *H01L 27/1461* (2013.01)

(58) Field of Classification Search
CPC ............................................. H01L 27/14643
See application file for complete search history.

(56) References Cited

U.S. PATENT DOCUMENTS

| 5,953,605 | A | * | 9/1999 | Kodama | H01L 21/2257 257/E21.151 |
| 6,197,645 | B1 | * | 3/2001 | Michael | H01L 29/41775 257/E21.433 |
| 6,211,026 | B1 | * | 4/2001 | Ahmad | H01L 21/823425 257/E21.433 |
| 6,218,711 | B1 | * | 4/2001 | Yu | H01L 21/28518 257/384 |
| 6,368,927 | B1 | * | 4/2002 | Lee | H01L 29/66628 257/E21.251 |
| 6,806,150 | B2 | * | 10/2004 | Park | H01L 21/28525 257/E21.131 |

(Continued)

*Primary Examiner* — Eugene Lee
(74) *Attorney, Agent, or Firm* — Christensen O'Connor Johnson Kindness PLLC

(57) ABSTRACT

An image sensor includes a plurality of photodiodes and a floating diffusion disposed in a semiconductor material. The image sensor also includes a plurality of transfer gates coupled between the plurality of photodiodes and the floating diffusion to transfer the image charge generated in the plurality of photodiodes into the floating diffusion. Peripheral circuitry is disposed proximate to the plurality of photodiodes and coupled to receive the image charge from the plurality of photodiodes. A shallow trench isolation structure is laterally disposed, at least in part, between the plurality of photodiodes and the peripheral circuitry to prevent electrical crosstalk between the plurality of photodiodes and the peripheral circuitry. The peripheral circuitry includes one or more transistors including a source electrode and a drain electrode that are raised above a surface of the semiconductor material.

20 Claims, 5 Drawing Sheets

(56) References Cited

U.S. PATENT DOCUMENTS

| | | | | |
|---|---|---|---|---|
| 8,404,540 B2* | 3/2013 | Cheng | ............... | H01L 21/26513 |
| | | | | 438/231 |
| 8,853,862 B2* | 10/2014 | Alptekin | ......... | H01L 21/823425 |
| | | | | 257/384 |
| 9,287,313 B2 | 3/2016 | Sze | | |
| 9,847,415 B2* | 12/2017 | Botula | ................ | H01L 29/7834 |
| 2002/0008261 A1* | 1/2002 | Nishiyama | ........ | H01L 21/28562 |
| | | | | 257/288 |
| 2004/0043595 A1* | 3/2004 | Lee | ................... | H01L 21/76889 |
| | | | | 438/592 |
| 2010/0123174 A1* | 5/2010 | Mao | .................. | H01L 27/14609 |
| | | | | 257/291 |
| 2011/0073923 A1* | 3/2011 | Tatani | ............... | H01L 27/14603 |
| | | | | 257/291 |
| 2014/0239152 A1* | 8/2014 | Chen | ................. | H01L 27/14605 |
| | | | | 250/208.1 |
| 2014/0291793 A1* | 10/2014 | Tanaka | .............. | H01L 27/14623 |
| | | | | 257/435 |
| 2015/0287759 A1* | 10/2015 | Matsumoto | ....... | H01L 27/14603 |
| | | | | 257/225 |
| 2017/0162623 A1* | 6/2017 | Ogawa | .............. | H01L 27/14689 |
| 2017/0201705 A1* | 7/2017 | Ishiwata | ............ | H04N 5/37457 |
| 2017/0317117 A1* | 11/2017 | Ukigaya | .............. | H01L 27/1463 |
| 2017/0338269 A1* | 11/2017 | Kimura | ................ | H04N 5/3696 |

* cited by examiner

US 10,079,261 B1

RAISED ELECTRODE TO REDUCE DARK CURRENT

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Low dark current is an important pixel performance metric. Dark current may cause image distortion due to unwanted charges accumulating in the image sensor. There are many sources of dark current in image sensors, but damage to the semiconductor lattice during the formation of isolation trenches has a significant impact.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
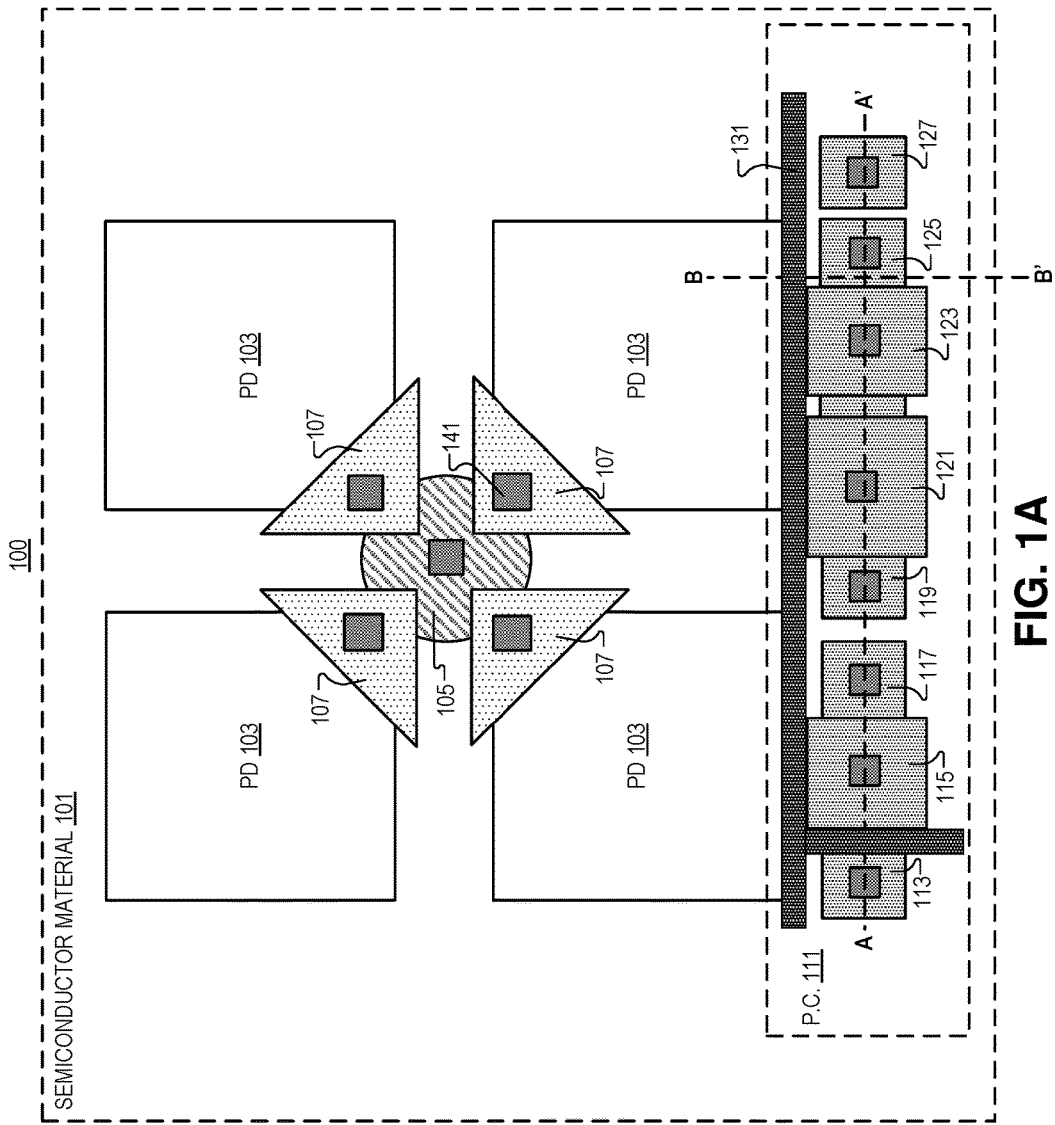
FIG. 1A illustrates an image sensor including raised electrodes and shallow trench isolation, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to a raised electrode to reduce dark current are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

To reduce dark current the present disclosure primarily employs two techniques: elevating (above the surface of a semiconductor wafer) source/drain electrodes in a peripheral circuit region of an image sensor, and separating pieces of image sensor device architecture using extra-shallow trench isolation structures. Since the source/drain electrodes are fabricated above the surface of the semiconductor wafer (rather than doped into the wafer as in a conventional image sensor) electric fields, created by the electrodes, in the wafer are located closer to the surface of the semiconductor material. This allows extra shallow trench isolation structures to be fabricated in the semiconductor wafer to separate pieces of circuitry. For example in a conventional image sensor, the trench isolation structures may need to extend into the semiconductor 0.2 µm or more to effectively block electrons from traveling between different pieces of circuitry. These isolation structures may cause a significant amount of dark current due to the number of broken bonds in the semiconductor material (formed by etching deep into the semiconductor). Conversely, trenches here may need to be etched 0.1 µm or less into the semiconductor material (and in some instances 0.6 µm or less). These shallow trenches result in fewer broken bonds in the semiconductor material and less dark current, in accordance with the teachings of the present disclosure.

FIG. 1A illustrates an image sensor 100. Image sensor 100 includes semiconductor material 101, plurality of photodiodes 103, floating diffusion 105, plurality of transfer gates 107, electrical contacts 141, and peripheral circuitry 111. The peripheral circuitry 111 depicted includes a first terminal (source) 113 of a reset transistor, a gate electrode 115 of the reset transistor, a second terminal (drain) electrode 117 of the reset transistor which is coupled to floating diffusion 105 (connection out of plane), a first terminal 119 of a source follower transistor, a gate terminal 121 of a source follower transistor, a gate terminal 123 of a row select transistor (note the first terminal of the row select transistor and the second terminal of the source follower transistor are coupled between gate terminal 121 and gate terminal 123), a second terminal 125 of the row select transistor (which is coupled to the bitline to read out an amplified image charge signal), a p+ contact 127 to the semiconductor material, and shallow trench isolation structure 131.

As shown, plurality of photodiodes 103 is disposed in semiconductor material 101 to convert image light into image charge, and floating diffusion 105 is also disposed in semiconductor material 101. Plurality of transfer gates 107 are coupled between plurality of photodiodes 103 and floating diffusion 105 to transfer the image charge generated in plurality of photodiodes 103 into floating diffusion 105. Peripheral circuitry 111 is disposed proximate to plurality of photodiodes 103, and is coupled to receive the image charge from plurality of photodiodes 103. Shallow trench isolation structure 131 is laterally disposed, at least in part, between plurality of photodiodes 103 and peripheral circuitry 111 to prevent electrical crosstalk between plurality of photodiodes 103 and peripheral circuitry 111. As shown, shallow trench isolation structure 131 is also disposed between first terminal (source) 113 of a reset transistor and gate terminal 115/drain terminal 117 of the reset transistor. However, in other examples, shallow trench isolation structure 131 may isolate (e.g., surround at least in part) any of electrical contacts 113-127 depicted in FIG. 1A.

Figure 1B:
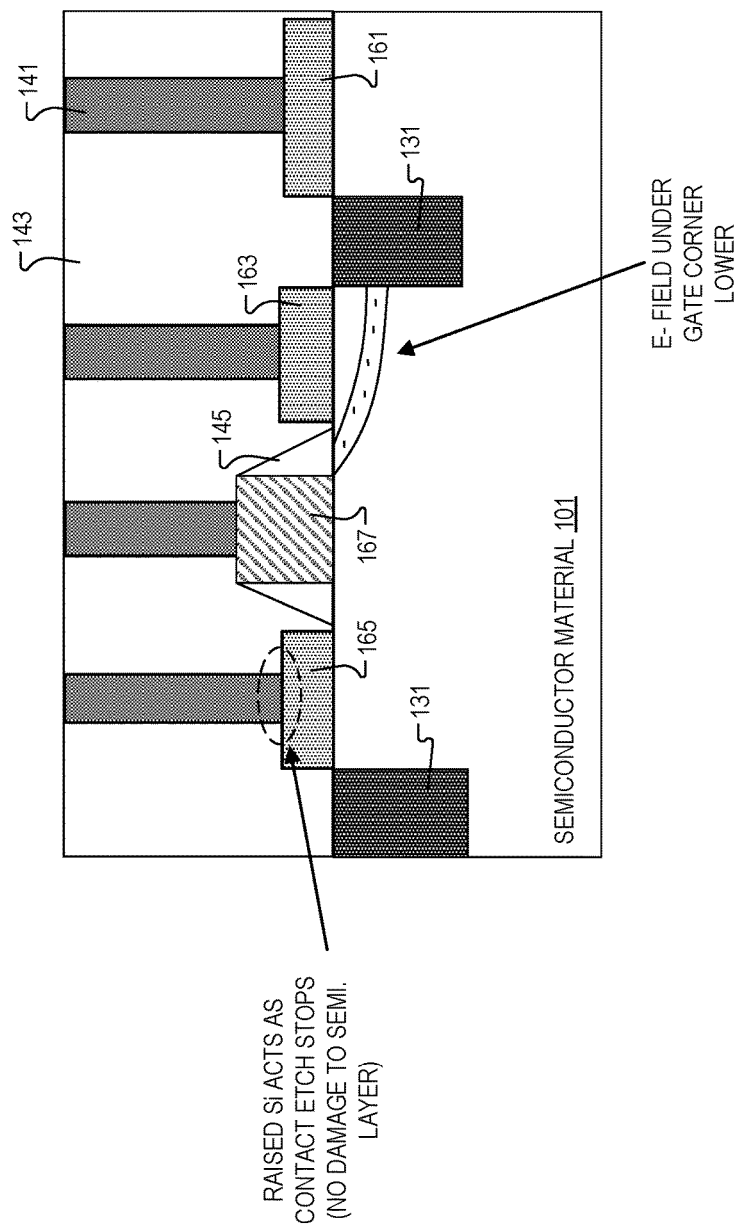
FIG. 1B illustrates a cross section (e.g., along line A-A') of peripheral circuitry that may be included in the image sensor of FIG. 1A, in accordance with the teachings of the present disclosure.

Peripheral circuitry 111 includes one or more transistors (e.g., the various transistors discussed above) that include a source electrode and a drain electrode raised above a surface of the semiconductor material 101 (illustrated in FIGS. 1A and 1B). In some examples, the source electrode and the drain electrode include epitaxially deposited silicon, and are disposed on the surface of semiconductor material 101. Moreover, to enhance conductivity, the source and drain electrodes may be doped via ion implantation. Dopant elements may include boron, arsenic, phosphorus or the like.

As stated above, the peripheral circuitry may include a reset transistor (which includes first terminal 113, gate electrode 115, and second terminal 117) coupled to floating diffusion 105 to reset image charge in floating diffusion 105 in response to a transfer signal. The peripheral circuitry may also include a source follower transistor (e.g., source 119 and gate electrode 121 depicted) where the gate terminal 121 of the source follower transistor is coupled to floating diffusion 105 (e.g., via contacts 141) to output an amplified signal of the image charge. A row select transistor (including gate terminal 123 and second/drain terminal 125) is coupled to output the amplified signal to a readout bit line.

Peripheral circuitry 111 also includes P+ contact 127 coupled to semiconductor material 101, which may be raised above the surface of semiconductor material 101. P+ contact 127 includes epitaxial silicon disposed on the surface of semiconductor material 101. In some examples, shallow trench isolation structure 131 may be laterally disposed on opposing sides of P+ contact 127 to electrically isolate P+ contact 127.

FIG. 1B illustrates a cross section (e.g., along line A-A') of peripheral circuitry that may be included in the image sensor of FIG. 1A. One of ordinary skill in the art having the benefit of the present disclosure will appreciate that the electrical contacts depicted may, or may not, correspond to the contacts depicted in FIG. 1A depending on the specific architecture of the image sensor peripheral circuitry employed.

Depicted is a source electrode 163, drain electrode 165, and gate electrode 167 (with insulation regions 145) of an example transistor. An additional electrode 161 (e.g., p+ contact or the like) is also depicted, and laterally separated from the example transistor by shallow trench isolation structure 131. In other words, image sensors in accordance with the teaching of the present disclosure may include a plurality of transistors in a peripheral circuit region, and some individual transistors in the plurality of transistors are electrically isolated from one another by shallow trench isolation structure 131. Shallow trench isolation structure 131 may be disposed between individual source electrodes and individual drain electrodes (e.g., source electrode 163 and electrode 161) of the individual transistors. In some examples, the depicted transistor may be at least partially surrounded by shallow trench isolation structures 131. All of the electrodes 161-165 are contacted by electrical contacts 141 which may include tungsten, copper, a silicide or the like. Electrical contacts 141 extend through isolation layer 143, and isolation layer 143 is disposed on semiconductor material 101 so that source electrodes and drain electrodes 161-165 are disposed between semiconductor material 101 and isolation layer 143. As shown, source electrodes and drain electrodes (e.g., electrodes 161-165) are raised above the surface of the semiconductor material by at least 300 Å. However, in other examples, electrodes 161-165 may be raised above the surface of semiconductor material 101 by as much as 1000 Å. As depicted, raised electrodes may result in more gradually sloping, and less extreme, electric fields underneath the gate electrodes 167. Additionally, raised electrodes may be used as etch-stop layers so damage to semiconductor material 101 can be avoided when trenches for electrical contacts 141 are etched into isolation layer 143. Thus reducing or eliminating another cause of dark current.

As shown, source electrodes and drain electrodes are raised above the surface of semiconductor material 101, and a depletion region (lines extending from under gate electrode 167) forms below in semiconductor material 101. In the depicted example, a majority of the depletion region extends from a surface (e.g., top surface) of semiconductor material 101 into semiconductor material 101 a first depth. Shallow trench isolation structure 131 extends from the surface of semiconductor material 101 into semiconductor material 101 a second depth (e.g., 0.1 μm or less), and the second depth is greater than the first depth. In other words, a majority of the depletion region does not extend into the semiconductor material 101 past shallow trench isolation structure 131. In the depicted example, shallow trench isolation structure 131 also has a width of 0.1 μm or less.

Figure 1C:
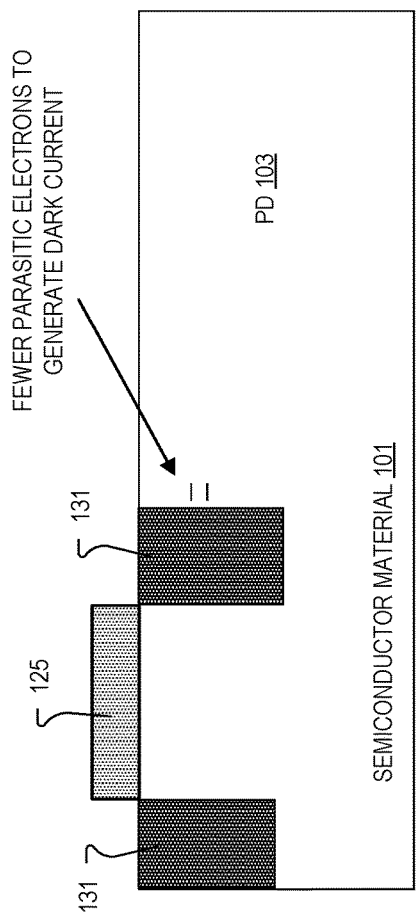
FIG. 1C illustrates a cross section (e.g., along line B-B') of peripheral circuitry that may be included in the image sensor of FIG. 1A, in accordance with the teachings of the present disclosure.

FIG. 1C illustrates a cross section (e.g., along line B-B') of peripheral circuitry that may be included in the image sensor of FIG. 1A. One of ordinary skill in the art having the benefit of the present disclosure will appreciate that the electrical contacts depicted may, or may not, correspond to the contacts depicted in FIG. 1A depending on the specific architecture of the image sensor peripheral circuitry employed.

As depicted, trench isolation structure 131 is laterally disposed, at least in part, between plurality of photodiodes 103 and peripheral circuitry 111 to prevent electrical crosstalk between plurality of photodiodes 103 and peripheral circuitry 111. Trench isolation structure 131 may, as depicted, also be disposed on the opposite lateral side of the peripheral circuitry from photodiode 103. Since shallow trench isolation structure 131 are not etched as deeply into semiconductor material 101 as convention trenches, there are fewer dangling bonds on the surface of the trenches resulting in less charge (dark current) that can find its way into pixels. These extra shallow trenches are made possible by the raised source/drain electrodes (e.g., electrode 125) in the peripheral circuitry.

Shallow trench isolation structure 131 may include oxides, semiconductor materials, or metals. For example, shallow trench isolation structure 131 may include a hafnium oxide exterior and a metal core coupled to receive a bias—which further reduces dark current in the image sensor. In other words, hafnium oxide (or another high-k oxide) may be disposed between semiconductor material 101 and a metal at the center of shallow trench isolation structure 131. Alternatively, shallow trench isolation structure 131 may include a low-k oxide like silicon oxide or the like.

Figure 2:
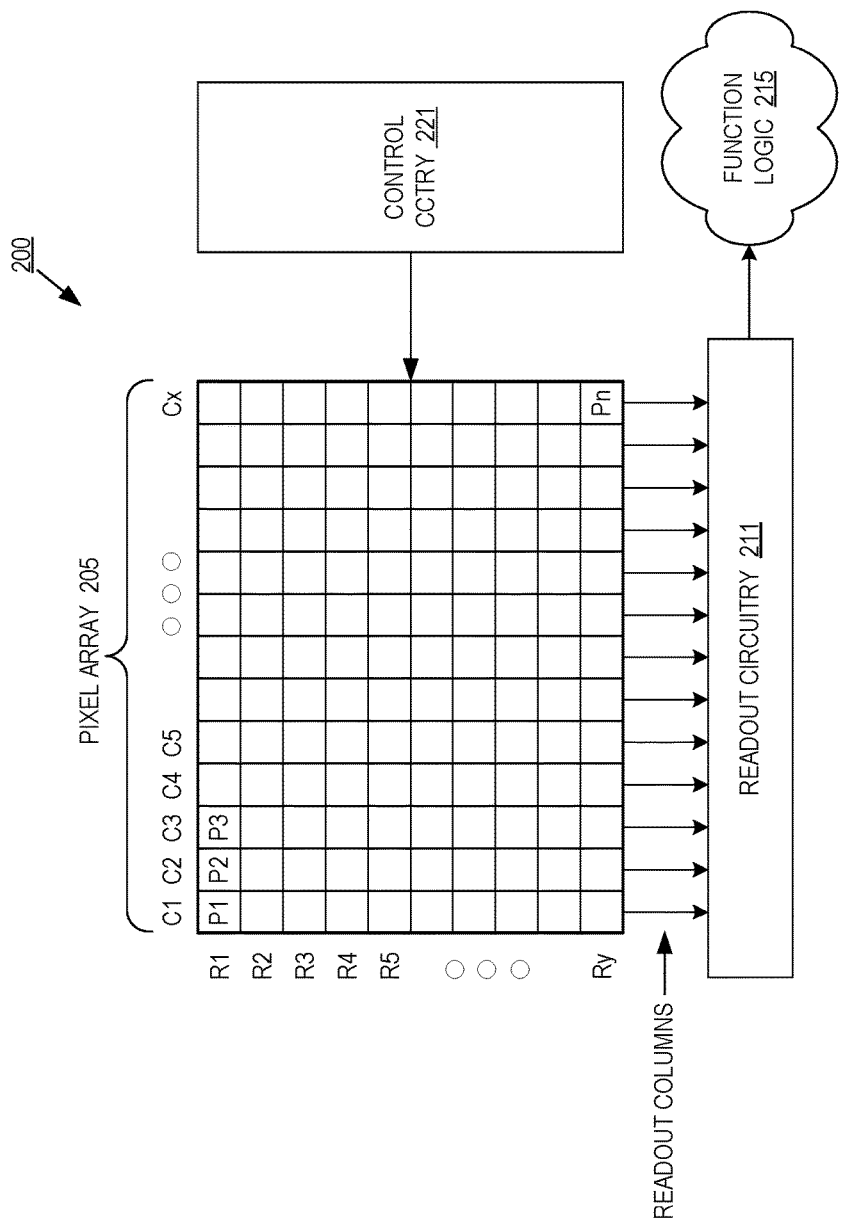
FIG. 2 illustrates a block diagram of one example of an imaging system which may include aspects of FIGS. 1A-1C, in accordance with the teachings of the present disclosure.

FIG. 2 illustrates a block diagram of one example of an imaging system which may include aspects of FIGS. 1A-1C. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., autofocus, crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
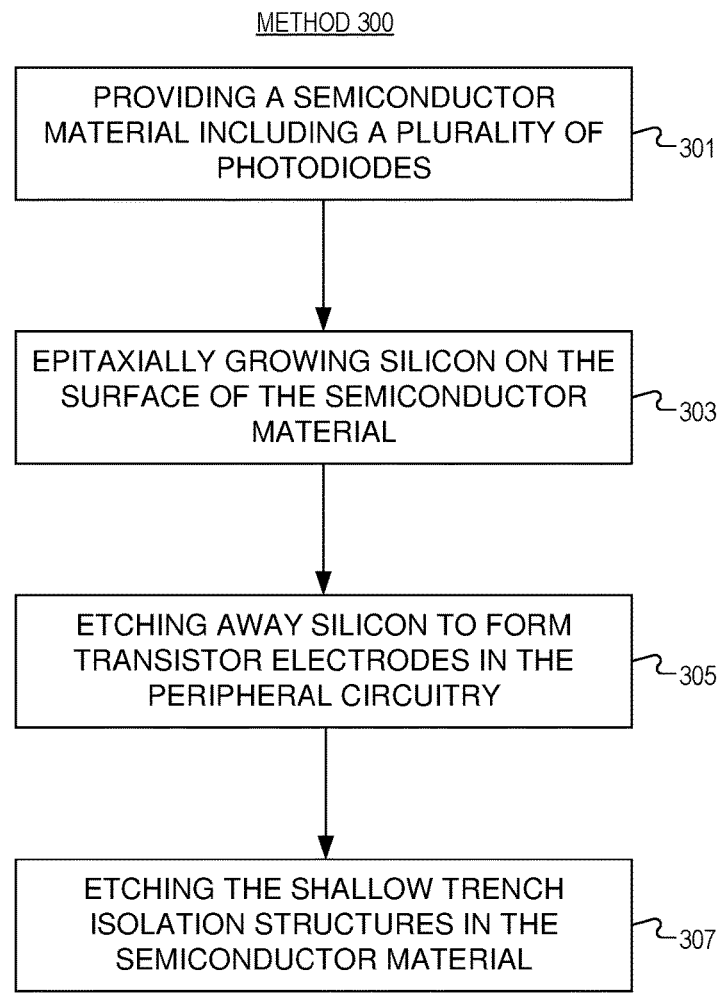
FIG. 3 illustrates a method of fabricating an image sensor, in accordance with the teachings of the present disclosure.

FIG. 3 illustrates method 300 of fabricating an image sensor. One of ordinary skill in the art having the benefit of the present disclosure will appreciate that the process blocks may appear in any order and even in parallel. Moreover, blocks can be added to, and removed from, method 300 in accordance with the teachings of the present disclosure.

Block 301 shows providing a semiconductor material (e.g., semiconductor material 101) including a plurality of photodiodes disposed in the semiconductor material. In one example, photodiodes may be formed in the semiconductor material via ion implantation or the like. The semiconductor material may also include a floating diffusion disposed proximate to the plurality of photodiodes.

Block 303 illustrates epitaxially growing silicon on the surface of the semiconductor material. Silicon may be grown by chemical vapor deposition, molecular beam epitaxy or the like.

Block 305 depicts etching away portions of the silicon to form transistor electrodes in the peripheral circuitry. Other pieces of device architecture may also be formed by etching away portions of the silicon, for example, the gate electrodes of the plurality of transfer transistors. Before or after the etching step, dopant may be implanted into the epitaxial silicon.

Block 307 shows etching the shallow trench isolation structures in the semiconductor material. Etching may be achieved with either a wet or dry etch. In some examples, the width and depth of shallow trench isolation structures may be 0.1 µm or less. After etching, the shallow trench isolation structures may be backfilled with oxide, semiconductor material, and/or metals.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed in a semiconductor material to convert image light into image charge;
   a floating diffusion disposed in the semiconductor material;
   a plurality of transfer gates coupled between the plurality of photodiodes and the floating diffusion to transfer the image charge generated in the plurality of photodiodes into the floating diffusion; and
   peripheral circuitry disposed proximate to the plurality of photodiodes and coupled to receive the image charge from the plurality of photodiodes, wherein a shallow trench isolation structure is laterally disposed, at least in part, between the plurality of photodiodes and the peripheral circuitry to prevent electrical crosstalk between the plurality of photodiodes and the peripheral circuitry, wherein the peripheral circuitry includes:
      one or more transistors including a source electrode and a drain electrode that are raised above a surface of the semiconductor material, wherein the source electrode and the drain electrode include silicon disposed on the surface of the semiconductor material; and
      a P+ contact to the semiconductor material raised above the surface of the semiconductor material, wherein the P+ contact includes silicon disposed on the surface of the semiconductor material, and wherein the shallow trench isolation structure is laterally disposed on opposing sides of the P+ contact to electrically isolate the P+ contact.

2. The image sensor of claim 1, wherein the one or more transistors includes a plurality of transistors, and wherein some individual transistors in the plurality of transistors are electrically isolated from one another by the shallow trench isolation structure disposed between individual source electrodes and individual drain electrode of the individual transistors.

3. The image sensor of claim 2, wherein the plurality of transistors includes:
a reset transistor coupled to the floating diffusion to reset image charge in the floating diffusion in response to a transfer signal;
a source follower transistor, wherein a gate terminal of the source follower transistor is coupled to the floating diffusion to output an amplified signal of the image charge; and
a row select transistor coupled to output the amplified signal to a readout bit line.

4. The image sensor of claim 1, wherein a depletion region forms under the source electrode and the drain electrode that are raised above the surface of the semiconductor material, and wherein a majority of the depletion region extends from a surface of the semiconductor material into the semiconductor material a first depth, and wherein the shallow trench isolation structure extends from the surface of the semiconductor material into the semiconductor material a second depth, and wherein the second depth is greater than the first depth.

5. The image sensor of claim 4, wherein the second depth is 0.1 μm or less from the surface of the semiconductor material.

6. The image sensor of claim 5, wherein the source electrode and the drain electrode are raised above the surface of the semiconductor material by at least 300 Å.

7. The image sensor of claim 1, wherein the source electrode and the drain electrode are epitaxial grown and include dopant deposited via ion-implantation.

8. The image sensor of claim 1, further comprising electrical contacts that extend through an isolation layer and contact the source electrode and the drain electrode but do not contact the semiconductor material, wherein the isolation layer is disposed on the semiconductor material so that the source electrode and the drain electrode are disposed between the semiconductor material and the isolation layer.

9. An image sensor system, comprising:
a plurality of photodiodes disposed in a semiconductor material to convert image light into image charge;
a floating diffusion disposed in the semiconductor material;
a plurality of transfer gates coupled between the plurality of photodiodes and the floating diffusion to transfer the image charge generated in the plurality of photodiodes into the floating diffusion; and
peripheral circuitry, disposed proximate to the plurality of photodiodes and coupled to receive the image charge from the plurality of photodiodes, wherein a shallow trench isolation structure is laterally disposed, at least in part, between the plurality of photodiodes and the peripheral circuitry to prevent electrical crosstalk between the plurality of photodiodes and the peripheral circuitry, wherein the peripheral circuitry includes:
at least a part of a readout circuitry coupled to readout image charge in the plurality of photodiodes;
at least a part of a control circuitry coupled to control image light capture of the plurality of photodiodes; and
one or more transistors, included in the readout circuitry, with a source electrode and a drain electrode that are raised above a surface of the semiconductor material, wherein the source electrode and the drain electrode include silicon disposed on the surface of the semiconductor material; and
a P+ contact to the semiconductor material raised above the surface of the semiconductor material, wherein the P+ contact includes silicon disposed on the surface of the semiconductor material, and wherein the shallow trench isolation structure is laterally disposed on opposing sides of the P+ contact to electrically isolate the P+ contact.

10. The image sensor system of claim 9, wherein the one or more transistors includes a plurality of transistors, and wherein some individual transistors in the plurality of transistors are electrically isolated from one another by the shallow trench isolation structure disposed between individual source electrodes and individual drain electrode of the individual transistors.

11. The image sensor system of claim 10, wherein the peripheral circuitry includes:
a reset transistor coupled to the floating diffusion to reset image charge in the floating diffusion in repose to a transfer signal;
a source follower transistor, wherein a gate terminal of the source follower transistor is coupled to the floating diffusion to output an amplified signal of the image charge; and
a row select transistor coupled to output the amplified signal from the source follower transistor to a readout bit line.

12. The image sensor system of claim 9, wherein a depletion region forms under the source electrode and the drain electrode that are raised above the surface of the semiconductor material, and wherein a majority of the depletion region extends from a surface of the semiconductor material into the semiconductor material a first depth, and wherein the shallow trench isolation structure extends from the surface of the semiconductor material into the semiconductor material a second depth, and wherein the second depth is greater than the first depth.

13. The image sensor system of claim 12, wherein the second depth is 0.1 μm or less from the surface of the semiconductor material.

14. The image sensor system of claim 13, wherein the source electrode and the drain electrode are raised above the surface of the semiconductor material by at least 300 Å.

15. The image sensor system of claim 9, wherein the source electrode and the drain electrode are epitaxial grown and include dopant deposited via ion-implantation.

16. The image sensor system of claim 9, further comprising electrical contacts that extend through an isolation layer and contact the source electrode and the drain electrode but do not contact the semiconductor material, wherein the isolation layer is disposed on the semiconductor material so that the source electrode and the drain electrode are disposed between the semiconductor material and the isolation layer.

17. The image sensor of claim 3, wherein the reset transistor includes the source electrode and the drain electrode, and wherein the source electrode is separated from the drain electrode and a gate terminal of the reset transistor with the shallow trench isolation structure, wherein the gate terminal is raised above the surface of the semiconductor material.

18. The image sensor of claim 17, wherein a source terminal of the source follower transistor and the gate terminal of the source follower transistor are raised above the surface of the semiconductor material.

19. The image sensor of claim 18, wherein the source follower transistor and the row select transistor share a terminal, and wherein a gate electrode of the row select transistor and a drain electrode of the row select transistor are raised above the surface of the semiconductor material.

20. The image sensor of claim 19, wherein the reset transistor, the source follower transistor, and the row select transistor are disposed in a line.

* * * * *